United States Patent [19]

Horikawa et al.

[11] Patent Number: 4,689,482

[45] Date of Patent: Aug. 25, 1987

[54] MULTIPLE LASER BEAM SCANNER WITH BEAM INTENSITY CONTROL

[75] Inventors: Kazuo Horikawa; Hideo Watanabe, both of Kaisei, Japan

[73] Assignee: Fuji Photo Film Co., Ltd., Minamiashigara, Japan

[21] Appl. No.: 744,413

[22] Filed: Jun. 13, 1985

[30] Foreign Application Priority Data

Jun. 13, 1984 [JP]   Japan ................................. 59-121089
May 31, 1985 [JP]   Japan ................................. 60-119315
May 31, 1985 [JP]   Japan ................................. 60-119316

[51] Int. Cl.$^4$ ............................................. G01J 1/32
[52] U.S. Cl. ............................. 250/205; 219/121 LA
[58] Field of Search .................... 250/205, 234–236; 350/6.5, 6.6, 6.9, 6.91, 3.73; 219/121 LA, 121 LB; 372/29

[56] References Cited

U.S. PATENT DOCUMENTS 3,668,984 6/1972 Rosin ..................................... 350/6.5

OTHER PUBLICATIONS

"Design In Action", *Machine Design*, pp. 148–149, Sep. 24, 1964.

*Primary Examiner*—David C. Nelms
*Assistant Examiner*—Crystal D. Cooper
*Attorney, Agent, or Firm*—Fleit, Jacobson, Cohn & Price

[57] ABSTRACT

A semiconductor laser beam scanning device includes a plurality of semiconductor lasers for emitting respective laser beams which are combined into a single laser beam to scan a desired surface. The amount of energy of the single laser beam is detected by a laser beam energy detector which applies a laser beam energy signal to a laser drive/control circuit. Alternatively, the laser beam energy signal is applied to a comparator which compares the laser beam energy signal with a reference signal and issues a difference signal to a control circuit connected to a laser drive circuit. The laser drive/control circuit or the control circuit is responsive to the applied signal for controllably energizing at least one of the semiconductor lasers to control the amount of energy of the laser beam emitted therefrom to thereby keep the amount of energy of the single laser beam at a constant level. The laser beam energy detector may be disposed adjacent to the surface to be scanned for detecting the amount of energy of the single laser beam in each scanning cycle, or may detect a laser beam divided from the single laser beam by a beam splitter disposed on a beam path for the single laser beam.

11 Claims, 7 Drawing Figures

MULTIPLE LASER BEAM SCANNER WITH BEAM INTENSITY CONTROL

BACKGROUND OF THE INVENTION

1. Field of the invention

The present invention relates to a semiconductor laser beam scanning device for combining the laser beams emitted from a plurality of semiconductor lasers into a single laser beam and for scanning the single laser beam.

2. Description of the Prior Art

Light beam scanning devices having light deflectors for deflecting light beams for line scanning are widely used in various apparatus such as scanning recorders or printers, scanning readout apparatus, and the like. Various means for generating the light beams have heretofore been employed in the light beam scanning devices. One of the conventional light beam sources is a semiconductor laser which is smaller in size, less costly, and lower in electric power consumption than gas lasers and other types of lasers. The semiconductor laser is also advantageous in that the emitted laser beam can be modulated directly by varying the drive current.

However, the semiconductor laser has its own shortcoming. Its output power is low. Semiconductor laser sources now commercially available can produce light outputs ranging from 20 to 30 mW, at most, when they are continuously excited. Therefore, the semiconductor laser cannot be employed in light beam scanning devices which require a high-energy light beam to be scanned, such as scanning recorders for recording images on low-sensitivity materials such as drawn materials, typically metal films and amorphous films.

When certain kinds of phosphors are exposed to a radiation such as X-rays, $\alpha$-rays, $\beta$-rays, $\gamma$-rays, cathode-rays or ultra-violet rays, they store a part of the energy of the radiation. Then, when the phosphor which has been exposed to the radiation is exposed to stimulating rays such as visible light, light is emitted by the phosphor in proportion to the stored energy of the radiation. A phosphor exhibiting such properties is referred to as a stimulable phosphor.

As disclosed in Japanese Unexamined Patent Publication Nos. 55(1980)-12429, 55(1980)-116340, 55(1980)-163472, 56(1981)-11395, and 56(1981)104645, for example, it has been proposed to use a stimulable phosphor in a radiation image recording and reproducing system. Specifically, a sheet provided with a layer of the stimulable phosphor (hereinafter referred to as a stimulable phosphor sheet) is first exposed to a radiation passing through an object such as a human body to have a radiation image stored thereon, and is then scanned with stimulating rays such as a laser beam which cause it to emit light in the pattern of the stored image. The light emitted by the stimulable phosphor sheet upon stimulation thereof is photoelectrically detected and converted to an electric image signal, which is processed as desired to reproduce a visible image on a recording medium such as a photographic light-sensitive material or on a display device such as a cathode ray tube (CRT).

It has been proposed to use a light beam scanning device having a semiconductor laser in the above radiation image recording and reproducing system for scanning the stimulable phosphor sheet to read the radiation image information stored on the stimulable phosphor sheet. It is however necessary to illuminate the phosphor with a stimulating ray of a sufficiently high energy in order to enable the stimulable phosphor sheet to emit light in response to exposure to the stimulating rays. Because of the output shortage, the light beam scanning device with the semiconductor laser has been difficult to employ in the radiation image recording and reproducing system for reading the radiation image information from the stimulable phosphor sheet.

One way to produce a scanning light beam of a sufficiently high energy from a semiconductor laser source would be to use a plurality of semiconductor lasers and combine the laser beams emitted from the semiconductor lasers into a single laser beam. The laser beams from the respective semiconductor lasers may be combined together somewhere in the light beam paths leading to a scanning spot, or be combined together on the scanning spot. As well known in the art, the amount of energy of a laser beam emitted from a semiconductor laser varies with time-dependent changes in the characteristics of the semiconductor laser, and also with the ambient temperature and various other factors. Therefore, it would be necessary to control the combined single laser beam for a constant amount of laser beam energy. It has been known to detect the amount of energy of a laser beam with a laser beam energy detector and feed a signal from the detector back to a laser beam energy control circuit for controlling the amount of energy of the emitted laser beam to keep it constant. However, such a conventional laser beam energy control arrangement would be disadvantageous if used with a plurality of semiconductor lasers for generating a single combined laser beam since there would be required as many laser beam energy detectors and control circuits as the number of semiconductor lasers employed, resulting in a large and expensive light beam scanning device.

SUMMARY OF THE INVENTION

It is an object of the present invention to provide a semiconductor laser beam scanning device which is capable of keeping constant the amount of energy of a single laser beam produced by combining the laser beams emitted from a plurality of semiconductor lasers, and which is small in size and inexpensive to manufacture.

According to the present invention, a semiconductor laser beam scanning device includes a plurality of semiconductor lasers for emitting respective laser beams, a means for combining the laser beams into a single laser beam, a means for scanning a surface with the single laser beam, a means for detecting the amount of energy of the single laser beam, and a control means responsive to a detected signal from the detecting means for controllably energizing at least one of the semiconductor lasers to control the amount of energy of the laser beam emitted therefrom to keep the amount of energy of the single laser beam at a constant level. With this arrangement, the amount of energy of the single laser beam which scans the surface is maintained at a desired constant level by controlling the amount of energy of the laser beam emitted from one or more of the semiconductor lasers. Since the control means is not required to control all of the semiconductor lasers, it is simple in arrangement, and hence the semiconductor laser beam scanning device is small in size and inexpensive to manufacture.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Identical or corresponding parts are denoted by identical or corresponding reference characters throughout the views.

Figure 1:
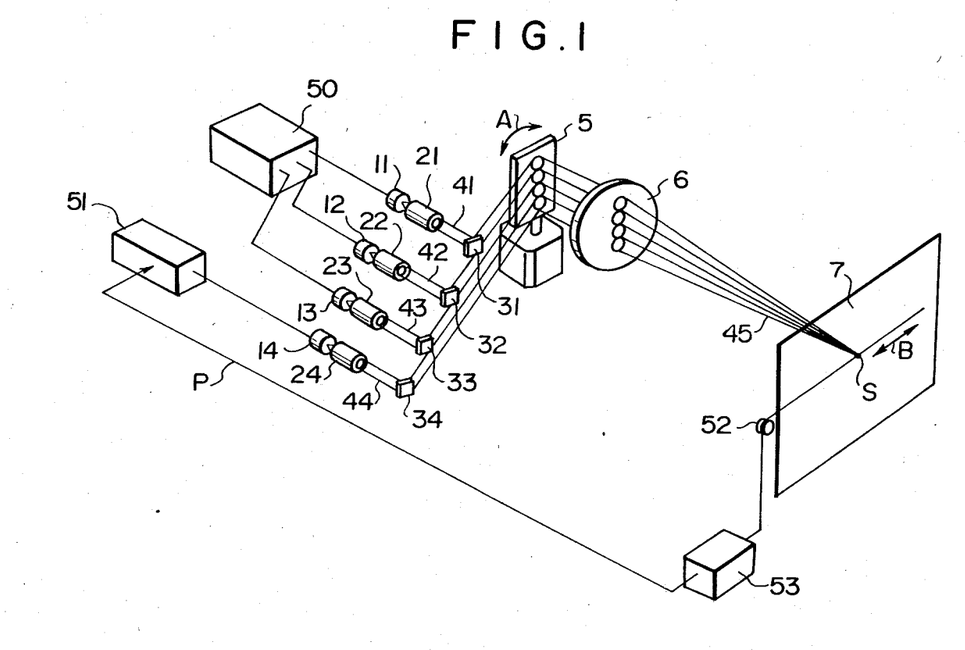
FIG. 1 is a schematic perspective view of a semiconductor laser beam scanning device according to a first embodiment of the present invention.

As shown in FIG. 1, a semiconductor laser beam device according to a first embodiment of the present invention includes a plurality (four in the illustrated embodiment) of semiconductor lasers 11, 12, 13, 14 spaced laterally from each other for emitting laser beams in parallel relation to each other. The semiconductor lasers 11, 12, 13, 14 are associated with respective collimator lenses 21, 22, 23, 24 and respective reflecting mirrors 31, 32, 33, 34. The laser beams emitted from the semiconductor lasers 11, 12, 13, 14 are converted by the collimator lenses 21, 22, 23, 24 to respective parallel beams 41, 42, 43, 44, which are reflected by the reflecting mirrors 31, 32, 33, 34, respectively, toward a common galvanometer mirror 5.

The galvanometer mirror 5 is reciprocally movable angularly in the directions of the arrow A for deflecting the parallel beams 41, 42, 43, 44 through an angular interval, which are combined by a common focusing lens 6 into a single laser beam 45 and each converged to a beam spot S. A surface 7 placed where the beam spot S is formed can therefore be scanned in the directions of the arrow B by a scanning beam of a high energy which is produced by combining the laser beams emitted from the semiconductor lasers 11, 12, 13, 14. The surface 7 to be scanned is flat, and hence the focusing lens 6 comprises an fθ lens.

The semiconductor lasers 11, 12, 13 out of the four semiconductor lasers are energized by a constant current supplied from a constant-current laser drive circuit 50 so that the amounts of energy of the laser beams emitted from the semiconductor lasers 11, 12, 13 will remain uncontrolled. The remaining semiconductor laser 14 is energized by a variable current fed from a laser drive/control circuit 51 for controlling the amount of energy of the laser beam emitted from the semidonductor laser 14. A laser beam energy detector 52 such as a photodiode is disposed in a position out of the effective scanning width on the surface 7 for detecting the amount of energy of the combined laser beam on the beam spot S. The output signal from the laser beam energy detector 52 is amplified by an amplifier 53 which applies the amplified signal as a beam energy signal P to the laser drive/control circuit 51.

As mentioned above, the amounts of energy of the laser beams emitted from the semiconductor lasers 11, 12, 13, 14 vary dependent on time-dependent changes in the characteristics of the semiconductor lasers 11, 12, 13, 14, and also with the ambient temperature and other factors, and hence the amount of energy of the beam spot S also varies therewith. The amount of energy of the beam spot S is detected by the laser beam energy detector 52 in each scanning cycle. The beam energy signal P indicating the detected amount of energy of the beam spot S is amplified and applied to the laser drive/control circuit 51. The laser drive/control circuit 51 compares the beam energy signal P with a reference beam energy signal representing a reference amount of laser beam energy. If the detected amount of laser beam energy is lower than the reference amount of laser beam energy, then the laser drive/control circuit 51 controls the semiconductor laser 14 to increase its output. Conversely, if the detected amount of laser beam energy is higher than the reference amount of laser beam energy, then the laser drive/control circuit 51 controls the semiconductor laser 14 to reduce its output. When the semiconductor laser 14 is thus controlled, undesired variations in the amount of laser beam energy in the combined beam spot S are eliminated to keep the laser beam energy constant in the beam spot S. The output of the semiconductor laser 14 may be controlled, i.e., increased and reduced, in proportion to the difference between the detected and reference amounts of laser beam energy, or may be controlled to vary by small fixed amounts.

One cycle of variations caused in the amounts of energy of the laser beams from the semiconductor lasers 11, 12, 13, 14 for the reasons given above is extremely long as compared with the period of a scanning cycle of the beam spot S. Therefore, the amount of energy of the beam spot S remains virtually unchanged in one scanning cycle, and can be maintained at a constant level simply by controlling the output of the semiconductor laser 14 dependent on the amount of energy of the beam spot S once in each scanning cycle. While the parallel beams 41, 42, 43, 44 are converged by the focusing lens 6 in the illustrated arrangement, the principles of the present invention are applicable to a semiconductor laser beam device in which a plurality of semiconductor lasers are arranged so that convergent laser beams emitted therefrom are combined so as to fall on a common beam spot.

Figure 2:
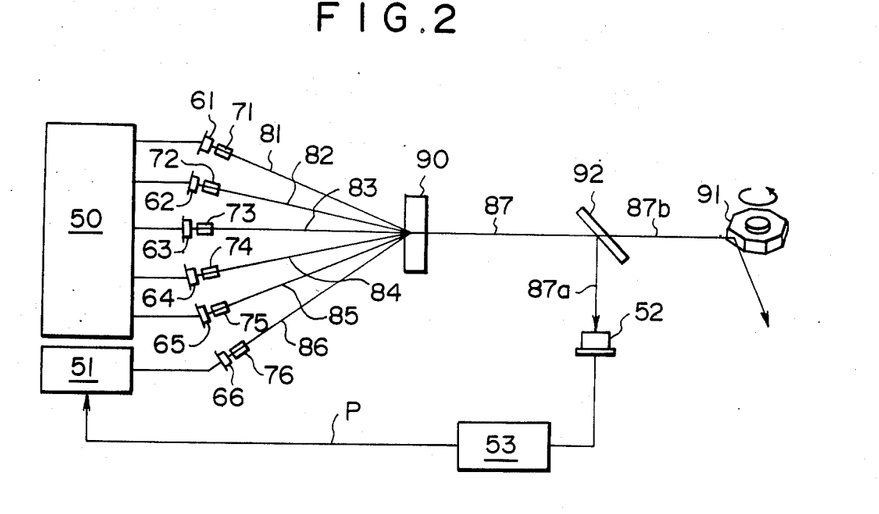
FIG. 2 is a schematic view of a semiconductor laser beam scanning device according to a second embodiment of the present invention.

FIG. 2 shows a semiconductor laser beam scanning device according to a second embodiment of the present invention. As shown in FIG. 2, the laser beams emitted respectively from six semiconductor lasers 61, 62, 63, 64, 65, 66 are converted by respective collimator lenses 71, 72, 73, 74, 75, 76 to parallel beams 81, 82, 83, 84, 85, 86, respectively. The parallel beams 81, 82, 83, 84, 85 are converged toward and combined by a hologram element 90 into a single high-energy laser beam 87 which is deflected by a rotating polygonal mirror 91, for example, to scan a surface (not shown).

The semiconductor lasers 61 through 65 out of the six semiconductor lasers are energized by a constant current supplied from a laser drive circuit 50 (identical to the laser drive circuit 50 shown in FIG. 1), and the remaining semiconductor laser 66 is energized by a variable current supplied from a laser drive/control circuit 51 (identical to the laser drive/control circuit 51 illustrated in FIG. 1). A half-silvered mirror or beam splitter 92 is positioned in the beam path for the combined beam 87 for dividing a laser beam 87a from the combined laser beam 87. The divided laser beam 87a falls on a laser beam energy detector 52 which detects the amount of energy of the laser beam 87a. The beam splitter 92 also allows a laser beam 87b to pass therethrough, the energy of the laser beam 87b being proportional to that of the laser beam 87a. Therefore, the amount of energy of the laser beam 87b can be detected by detecting the amount of energy of the divided laser beam 87a with the detector 52. The output signal from the detector 52 is amplified by an amplifier 53 which issues a laser beam energy signal P to the laser drive/control circuit 51. The laser drive/control circuit 51 operates in the same manner as the laser drive/control circuit 51 in FIG. 1 for controlling the amount of energy of the laser beam 87b to be kept at a constant level dependent on the laser beam energy signal P.

Instead of the hologram element 90, another known beam combining means such as a biaxial crystal element may be employed for combining the laser beam emitted from the semiconductor lasers 61 through 66 into a single laser beam before reaching a scanning spot. The galvanometer mirror 5 (FIG. 1) or the polygonal mirror 91 (FIG. 2) may be replaced with a hologram scanner or the like.

Figure 3:
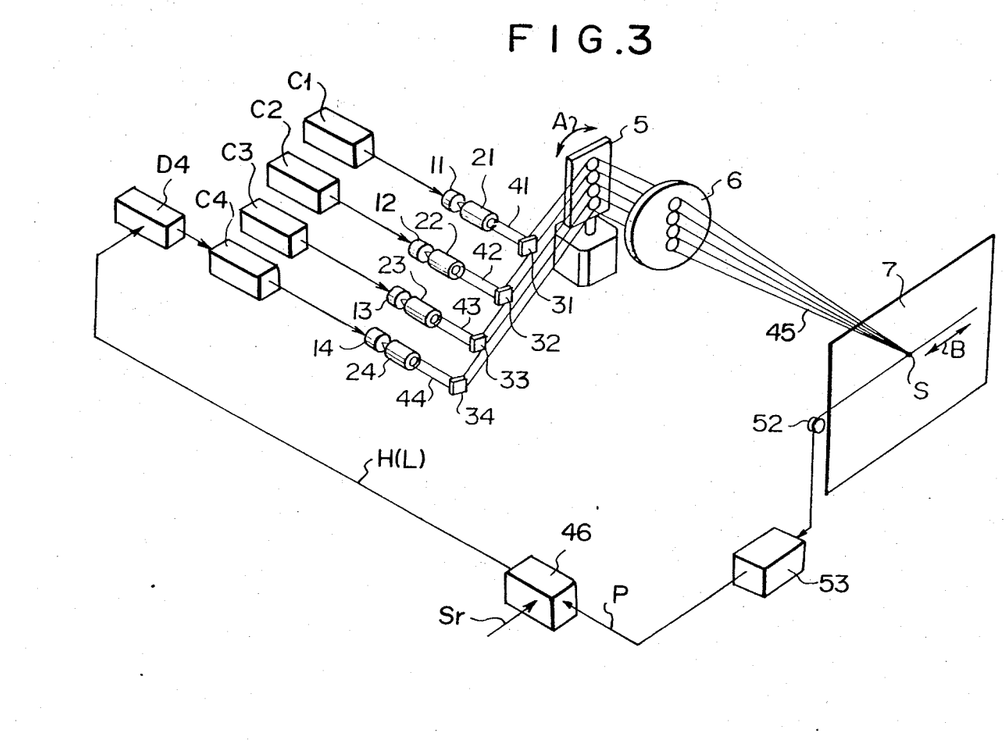
FIG. 3 is schematic perspective view of a semiconductor laser beam scanning device according to a third embodiment of the present invention.

FIG. 3 shows a semiconductor laser beam scanning device according to a third embodiment of the present invention. Since the semiconductor laser beam shown in FIG. 3 is similar to the semiconductor laser beam of FIG. 1, the different structural details will mainly be described. As illustrated in FIG. 3, the four semiconductor lasers 11, 12, 13, 14 are energized by constant currents supplied from respective constant-current laser drive circuits C1, C2, C3, C4. Since the semiconductor lasers 11 through 14 are energized by the supplied constant currents, any variation in the amounts of energy of the parallel laser beams 41 through 44 and hence in the amount of energy of the single laser beam 45 is suppressed to a certain extent. To prevent the amount of energy of the single laser beam 45 from being varied, a control circuit D4 capable of varying the current setting in the constant-current laser drive circuit is connected to one of the constant-current laser drive circuits (C4 in the embodiment of FIG. 3). Between the amplifier 53 and the control circuit D4, there is connected a comparator 51 for comparing the beam energy signal P fed from the amplifier 53 and a reference signal Sr representative of a prescribed amount of energy of the laser beam spot S produced by the single laser beam 45.

In operation, the amount of energy of the laser beam spot S is detected by the laser beam energy detector 52 in each scanning cycle. The beam energy signal P is supplied from amplifier 53 to the comparator 46 which compares the signal P with the reference signal Sr. If the beam energy signal P is greater than the reference signal Sr, i.e., if the amount of energy of the laser beam spot S is higher than the prescribed amount of energy, then the comparator 46 generates a difference signal of a high level. If the beam energy signal P is lower than the reference signal Sr, then the comparator 46 produces a difference signal of a low level.

The high- or low-level difference signal generated by the comparator 46 is applied to the control circuit D4. The control circuit D4 lowers the current setting in the constant-current laser drive circuit C4 so long as the high-level signal is applied to the control circuit D4. The laser beam output emitted from the semiconductor laser 14 is then lowered to reduce the amount of energy of the laser beam spot S toward the prescribed amount of energy. Conversely, the control circuit D4 increases the current setting in the constant-current laser drive circuit C4 in response to the low-level signal from the comparator 46. Then, the laser beam output emitted from the semiconductor laser 14 is increased to cause the amount of energy of the laser beam spot S to approach the prescribed amount of energy. Stated otherwise, the laser drive circuit C4 is controlled by the control circuit D4 to vary the laser beam output from the semiconductor laser 14 so that the difference signal produced by the comparator 46 will be eliminated. Therefore, the amount of energy of the laser beam spot S is kept equal to the prescribed amount of energy. The current setting in the constant-current laser drive circuit C4 is increased or reduced a small fixed amount by the control circuit D4. However, the comparator 51 may comprise a circuit capable of generating a signal having a level proportional to the difference between the laser beam energy signal P and the reference signal Sr, and the current setting in the constant-current laser drive circuit C4 may directly be varied by such a difference-dependent signal.

Figure 4:
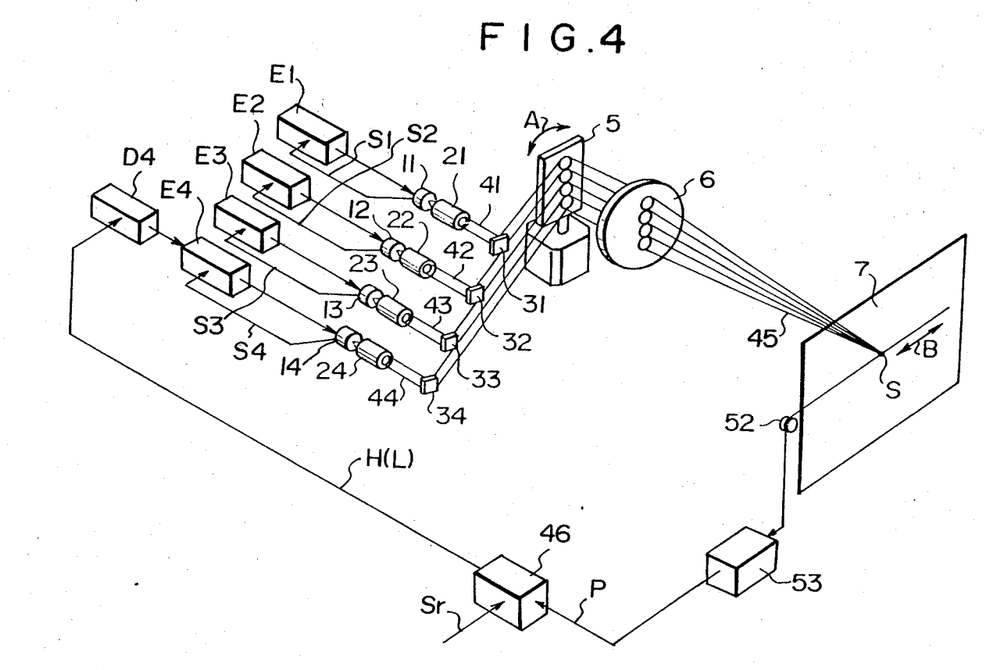
FIG. 4 is schematic perspective view of a semiconductor laser beam scanning device according to a fourth embodiment of the present invention.

FIG. 4 illustrates a semiconductor laser beam scanning device according to a fourth embodiment of the present invention. The semiconductor laser beam scanning device of FIG. 4 is substantially the same as the semiconductor laser beam scanning device shown in FIG. 3 except that the semiconductor lasers 11, 12, 13, 14 are energized by drive currents supplied from respective constant-output laser drive circuits E1, E2, E3, E4. The semiconductor lasers 11, 12, 13, 14 have light detectors (not shown) mounted in the laser casings, respectively, thereof for generating laser beam energy signals S1, S2, S3, S4 which are fed back to the constant-output laser drive circuits E1, E2, E3, E4, respectively. In response to the laser beam energy signals S1 through S4, the constant-output laser drive circuits E1 through E4 control the drive currents so that the laser beam energy signals S1 through S4 will have prescribed values, i.e., the amounts of energy of the laser beams 41 through 44 will have prescribed values. A control circuit D4 identical to the control circuit D4 in FIG. 3 is connected to the constant-output laser drive circuit E4 for controlling the drive current supplied from the laser drive circuit E4 in response to a high- or low-level signal fed from a comparator 46, identical to the comparator 46 in FIG. 3, connected to the amplifier 53. Therefore, the laser beam 44 emitted from the semiconductor laser 14 is controlled to keep the amount of energy of the single laser beam 45 at a prescribed constant level.

Figure 5:
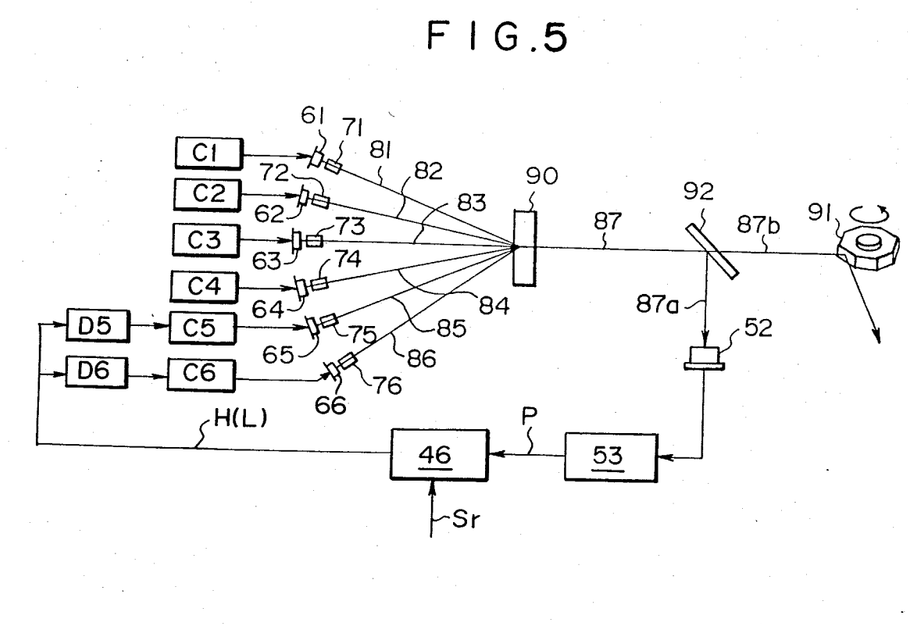
FIG. 5 is schematic view of a semiconductor laser beam scanning device according to a fifth embodiment of the present invention.

A semiconductor laser beam scanning device according to a fifth embodiment shown in FIG. 5 differs from the semiconductor laser beam scanning device of FIG. 2 in that the six semiconductor lasers 61 through 66 are energized by constant currents supplied from respective constant-current laser drive circuits C1, C2, C3, C4, C5, C6. The current settings in the constant-current laser drive circuits C5, C6 can be varied by control circuits D5, D6 connected thereto, respectively, each of the control circuits D5, D6 being identical to the control circuit D4 shown in FIG. 2. A comparator 51, identical to the comparator 46 of FIG. 2, is connected between the amplifier 53 and the control circuits D5, D6. The beam energy signal P indicative of the amount of energy of the laser beam 87b is supplied from the amplifier 53 to the comparator 46 which compares the beam energy signal P with a reference signal Sr. A signal of a high or low level is then issued from the comparator 46 to the control circuits D5, D6 to enable the control circuits D5, D6 to control the current settings in the drive circuits C5, C6 for varying the amounts of laser beams 85, 86 emitted from the semiconductor lasers 65, 66, thus keeping the laser beam 87b at a prescribed level.

Figure 6:
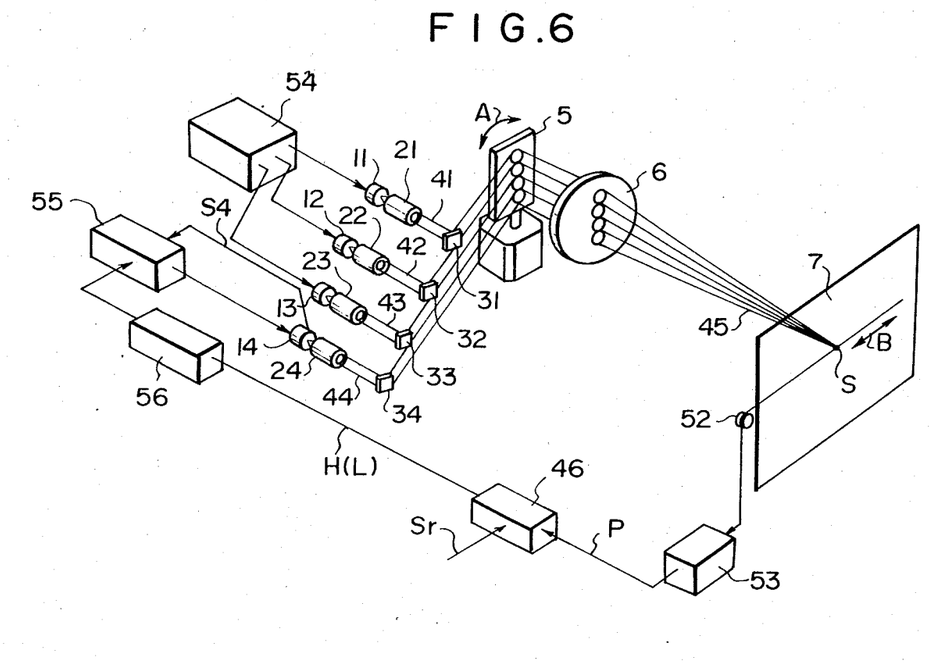
FIG. 6 is schematic perspective view of a semiconductor laser beam scanning device according to a sixth embodiment of the present invention.

FIG. 6 shows a semiconductor laser beam scanning device according to a sixth embodiment of the present invention. The semiconductor laser beam scanning device of FIG. 6 is similar to the semiconductor laser beam scanning device illustrated in FIG. 4. The semiconductor lasers 11, 12, 13 out of the four semiconductor lasers are energized by a constant current supplied from a constant-current laser drive circuit 54 identical to the laser drive circuit 50 shown in FIG. 1. The remaining semiconductor laser 14 is energized by a constant-output laser drive circuit 55 identical to the constant-output laser drive circuit E4 shown in FIG. 4. The semiconductor laser 14 has a light detector mounted in the laser casing thereof for generating a laser beam energy signal S4 which is fed back to the constant-output laser drive circuit 55. In response to the laser beam energy signal S4, the constant-output laser drive circuit 55 controls the drive current so that the laser beam energy signal S4 will have a prescribed value, i.e., the amount of energy of the laser beam 44 will have a prescribed value. A control circuit 56 identical to the control circuit D4 in FIG. 4 is connected to the constant-output laser drive circuit 55 for controlling the drive current supplied from the laser drive circuit 55 in response to a high- or low-level signal fed from a comparator 46, identical to the comparator 46 in FIG. 4, connected to the amplifier 53. Therefore, the laser beam 44 emitted from the semiconductor laser 14 is controlled to keep the amount of energy of the single laser beam 45 at a prescribed constant level.

Figure 7:
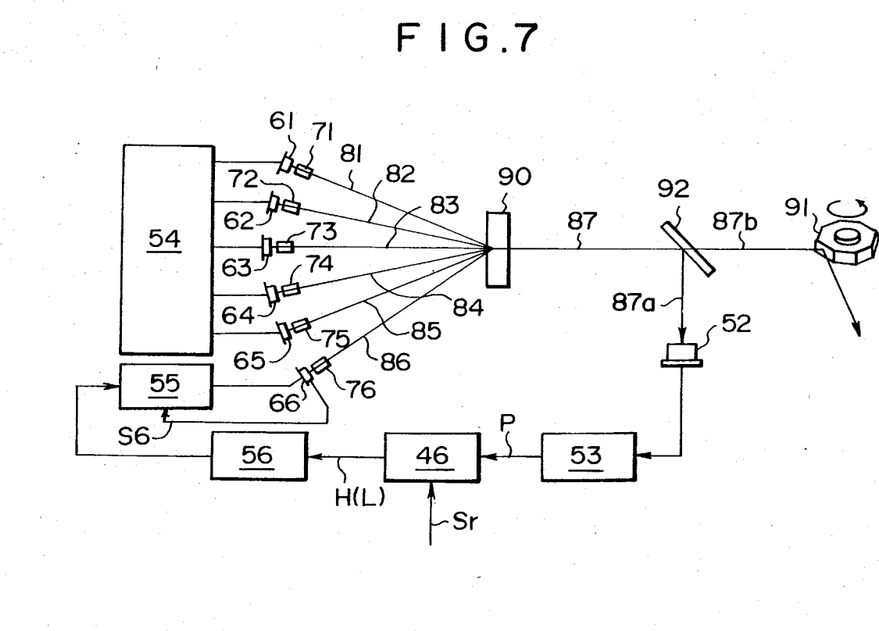
FIG. 7 is schematic view of a semiconductor laser beam scanning device according to a seventh embodiment of the present invention.

FIG. 7 illustrates a semiconductor laser beam scanning device according to a seventh embodiment of the present invention, which is similar to the fifth embodiment shown in FIG. 5. The semiconductor lasers 61, 62, 63, 64, 65 out of the six semiconductor lasers are energized by a constant current supplied from a constant-current laser drive circuit 54 identical to the laser drive circuit 50 shown in FIG. 1. The remaining semiconductor laser 66 is energized by a constant-output laser drive circuit 55 identical to the constant-output laser drive circuit 55 shown in FIG. 6. The semiconductor laser 66 has a light detector mounted in the laser casing thereof for generating a laser beam energy signal S4 which is fed back to the constant-output laser drive circuit 55. In response to the laser beam energy signal S4, the constant-output laser drive circuit 55 controls the drive current so that the laser beam energy signal S4 will have a prescribed value, i.e., the amount of energy of the laser beam 44 will have a prescribed value. A control circuit 56 identical to the control circuit 56 in FIG. 6 is connected to the constant-output laser drive circuit 55 for controlling the drive current fed from the laser drive circuit 55 in response to a high- or low-level signal fed from a comparator 46, identical to the comparator 46 in FIG. 6, connected to the amplifier 53. The laser beam 44 emitted from the semiconductor laser 66 is thus controlled to keep the amount of energy of the laser beam 87b at a prescribed constant level.

The number of laser beams to be combined into a single laser beam is not limited to four or six as illustrated in the foregoing embodiments. Where more laser beams are combined so that the amount of energy of the combined laser beam will tend to vary to a greater extent, two or more semiconductor lasers may be controlled for varying the amounts of energy of laser beams emitted therefrom to provide a wider laser beam energy control range than the extent to which the amount of energy of the combined laser beam varies.

Although certain preferred embodiments have been shown and described, it should be understood that many changes and modifications may be made therein without departing from the scope of the appended claims.

We claim:

1. A semiconductor laser beam scanning device comprising:
    (i) a plurality of semiconductor lasers for emitting respective laser beams;
    (ii) means for combining said laser beams into a single laser beam;
    (iii) means for scanning a surface with said single laser beam;
    (iv) means for detecting the amount of energy of said single laser beam; and
    (v) control means responsive to a detected signal from said detecting means for controllably energizing a part of said semiconductor lasers to control the amount of energy of the laser beam emitted therefrom to keep the amount of energy of said single laser beam at a constant level.

2. A semiconductor laser beam scanning device according to claim 1, wherein said detecting means comprises a laser beam energy detector disposed adjacent to said surface for detecting the amount of energy of said single laser beam in each cycle of scanning of said surface.

3. A semiconductor laser beam scanning device according to claim 1, wherein said detecting means comprises a beam splitter disposed in a beam path for said single laser beam for dividing a laser beam from said single laser beam, and a laser beam energy detector for detecting the amount of energy of said divided laser beam.

4. A semiconductor laser beam scanning device according to claim 1, wherein said semiconductor lasers are arranged to generate the laser beams parallel to each other, said scanning means comprises a galvanometer mirror for deflecting said laser beams, and said combining means comprises a focusing lens for converging said laser beams onto said surface.

5. A semiconductor laser beam scanning device according to claim 1, wherein said combining means comprises a hologram element, and said semiconductor lasers are arranged to generate the laser beams convergent toward said hologram element.

6. A semiconductor laser beam scanning device according to claim 1, wherein said control means comprises a laser drive/control circuit including means for comparing said detected signal with a reference laser beam signal representative of a prescribed amount of energy of said single laser beam and for energizing said at least one semiconductor laser based on the difference between said detected signal and said reference laser beam signal.

7. A semiconductor laser beam scanning device according to claim 1, wherein said control means comprises a laser drive circuit for generating a drive current to energize said at least one semiconductor laser, a comparator for comparing said detected signal with a reference laser beam signal representative of a prescribed amount of energy of said single laser beam and for producing a difference signal indicative of the difference between said detected signal and said reference laser beam signal, and a control circuit responsive to said difference signal for controlling said laser drive circuit to vary said drive current so that said difference signal will be eliminated.

8. A semiconductor laser beam scanning device according to claim 7, wherein said laser drive circuit comprises a constant-current laser drive circuit with a current setting variable by said control circuit, including a common constant-current laser drive circuit for energizing the semiconductor lasers except said at least one semiconductor laser.

9. A semiconductor laser beam scanning device according to claim 7, wherein said laser drive circuit comprises a constant-current laser drive circuit with a current setting variable by said control circuit, including a plurality of constant-current laser drive circuits for energizing the respective semiconductor lasers except said at least one semiconductor laser.

10. A semiconductor laser beam scanning device according to claim 7, wherein said laser drive circuit comprises a constant-output laser drive circuit with a laser drive current variable by said control circuit, including a plurality of constant-output laser drive circuits for energizing the respective semiconductor lasers except said at least one semiconductor laser.

11. A semiconductor laser beam scanning device according to claim 7, wherein said laser drive circuit comprises a constant-output laser drive circuit with a laser drive current variable by said control circuit, including a common constant-current laser drive circuit for energizing the semiconductor lasers except said at least one semiconductor laser.

* * * * *